United States Patent
Seväkivi

(10) Patent No.: US 8,462,507 B2
(45) Date of Patent: Jun. 11, 2013

(54) COOLING ELEMENT

(75) Inventor: Pertti Seväkivi, Lepsämä (FI)

(73) Assignee: ABB Oy, Helsinki (FI)

( * ) Notice: Subject to any disclaimer, the term of this patent is extended or adjusted under 35 U.S.C. 154(b) by 189 days.

(21) Appl. No.: 13/010,463

(22) Filed: Jan. 20, 2011

(65) Prior Publication Data

US 2011/0176274 A1    Jul. 21, 2011

(30) Foreign Application Priority Data

Jan. 20, 2010  (EP) .................................. 10151195

(51) Int. Cl.
*H05K 7/20* (2006.01)
*F28F 1/00* (2006.01)

(52) U.S. Cl.
USPC ............... 361/699; 361/679.53; 361/679.54; 361/700; 361/698; 165/80.4; 165/121; 165/104.33; 165/185; 62/259.2

(58) Field of Classification Search
USPC ............ 361/679.46–679.55, 690–697, 688, 361/689, 700–714, 717–724; 165/80.2–80.5, 165/104.14, 104.19–21, 104.33, 104.34, 165/121–126, 148, 168, 185; 62/259.2, 3.7; 454/184; 257/714
See application file for complete search history.

(56) References Cited

U.S. PATENT DOCUMENTS

| 4,712,158 A | * | 12/1987 | Kikuchi et al. | 361/699 |
| 4,956,245 A | * | 9/1990 | Shimizu et al. | 429/434 |
| 5,697,428 A | * | 12/1997 | Akachi | 165/104.21 |
| 5,729,995 A | | 3/1998 | Tajima | |
| 6,173,759 B1 | * | 1/2001 | Galyon et al. | 165/80.4 |
| 6,462,949 B1 | * | 10/2002 | Parish et al. | 361/699 |
| 6,653,709 B2 | * | 11/2003 | Wu et al. | 257/499 |
| 7,986,528 B2 | * | 7/2011 | Aoki | 361/702 |
| 2003/0136548 A1 | | 7/2003 | Parish et al. | |
| 2004/0188132 A1 | * | 9/2004 | Borrego Bel et al. | 174/252 |
| 2005/0099775 A1 | * | 5/2005 | Pokharna et al. | 361/700 |
| 2005/0180106 A1 | * | 8/2005 | Ohashi et al. | 361/699 |
| 2007/0240867 A1 | * | 10/2007 | Amano et al. | 165/168 |
| 2008/0205002 A1 | * | 8/2008 | Chui | 361/699 |
| 2009/0211743 A1 | * | 8/2009 | Schrader et al. | 165/173 |

FOREIGN PATENT DOCUMENTS

| DE | 196 10 851 A1 | | 9/1996 |
| JP | 356067949 A | * | 6/1981 |
| JP | 408078027 A | * | 3/1996 |
| JP | 9-061074 A | | 3/1997 |
| JP | 410098144 A | * | 4/1998 |
| JP | 2003-148884 A | | 5/2003 |
| WO | 2009/113959 A1 | | 9/2009 |

OTHER PUBLICATIONS

European Search Report for EP 10151195 dated Sep. 10, 2010.

* cited by examiner

*Primary Examiner* — Michail V Datskovskiy
(74) *Attorney, Agent, or Firm* — Buchanan Ingersoll & Rooney PC

(57) ABSTRACT

A cooling element for an electronic apparatus can include an inlet for receiving fluid, an outlet for forwarding fluid from the cooling element, and multiple pipes providing parallel fluid paths for passing the fluid from the inlet to the outlet. To obtain a simple and efficient cooling element, multiple base plates for receiving electronic components can be attached to the pipes for conducting heat generated by the electronic components to the fluid in the pipes.

10 Claims, 3 Drawing Sheets

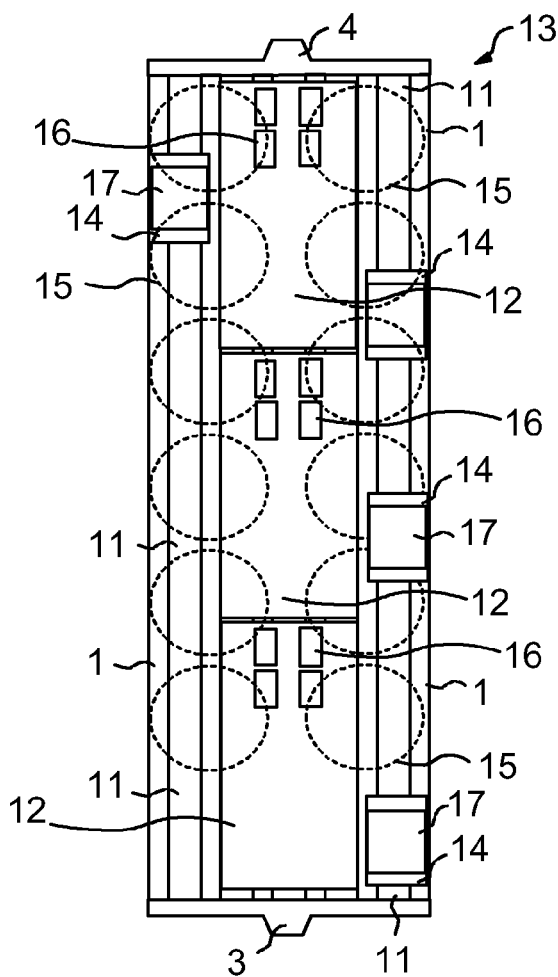
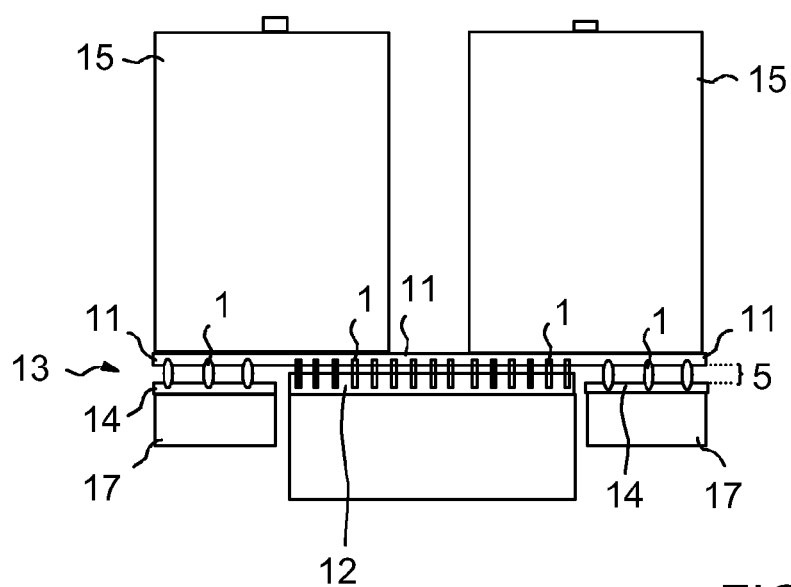
FIG. 3
FIG. 4

COOLING ELEMENT

RELATED APPLICATION

This application claims priority under 35 U.S.C. §119 to European Patent Application No. 10151195.4 filed in Europe on Jan. 20, 2010, the entire content of which is hereby incorporated by reference in its entirety.

FIELD

The present disclosure relates to a cooling element, for example, for an electronic apparatus.

BACKGROUND INFORMATION

A known technique utilized in electronic apparatuses for cooling electronic components, is to attach such components to cooling elements. In applications where the amount of heat generated by the electronic components is significant, the cooling elements can be provided with channels through which a cooling fluid can be passed. The heat generated by the electronic components can therefore be transferred to the fluid, which is then passed on to an external device for cooling before the fluid is returned to the cooling elements.

The amount of heat generated by the different components can vary depending on the type of the electronic component in question. In known techniques, only those components which generate significant amounts of heat are provided with a cooling element, through which a cooling fluid is passed. The cooling elements of the different components can be connected to each other by pipes, such that the same fluid may pass through the different cooling elements.

The cooling apparatus can become complicated. The number of fluid-cooled cooling elements can be significant, and also the number of pipes and pipe joints connecting the different cooling elements to each other can be significant. Therefore the production and assembly of such an apparatus can be cumbersome and expensive, and for each pipe joint there exists a risk of leakage.

SUMMARY

A cooling element for an electronic apparatus is disclosed, the cooling element comprising: an inlet for receiving fluid; an outlet for forwarding the fluid from the cooling element; plural pipes providing parallel fluid paths for passing the fluid from the inlet to the outlet; plural base plates for receiving electronic components, the base plates being attached to the plural pipes and for conducting heat generated by the electronic components when operative to the fluid in the pipes.

An electronic apparatus is disclosed, comprising: a housing; electronic components enclosed by the housing; a cooling element enclosed by the housing and including: an inlet for receiving fluid; an outlet for forwarding fluid from the cooling element; plural pipes providing parallel fluid paths for passing the fluid from the inlet to the outlet; plural base plates for receiving electronic components, the base plates being attached to the plural pipes for conducting heat generated by the electronic components when operative to the fluid in the pipes; and a cooling device arranged outside the housing and connected to the inlet and outlet of the cooling element for cooling fluid received via the outlet and for returning the cooled fluid to the cooling element via the inlet.

BRIEF DESCRIPTION OF DRAWINGS

In the following exemplary embodiments, the present disclosure will be described in closer detail by way of reference to the attached drawings, in which:

FIGS. 3 and 4 illustrate an exemplary embodiment of a cooling element; and

DETAILED DESCRIPTION

Exemplary embodiments disclosed herein include a cooling element which is reliable, simple to produce and utilize in an electronic apparatus, and which can provide efficient cooling.

Utilization of a plurality of base plates for receiving electronic components by attaching these base plates to a plurality of pipes providing parallel fluid paths for passing fluid between an inlet and an outlet, can allow for utilization of the same cooling element for a plurality of electronic components. With such a cooling element, it may not be necessary to have separate cooling elements for different components, but instead the different electronic components can be attached to the same cooling element via base plates attached to the plurality of pipes at the locations of the electronic components are to be cooled.

Figure 1:
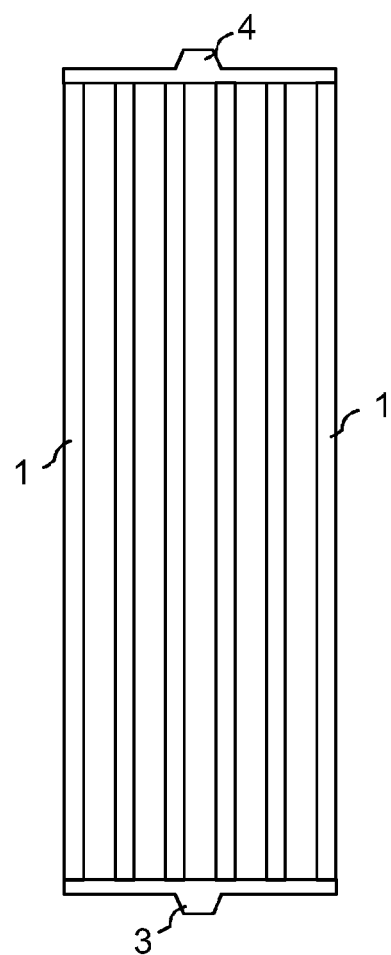
FIG. 1 illustrates a pipe assembly of a cooling element, in accordance with an exemplary embodiment.
Figure 2:
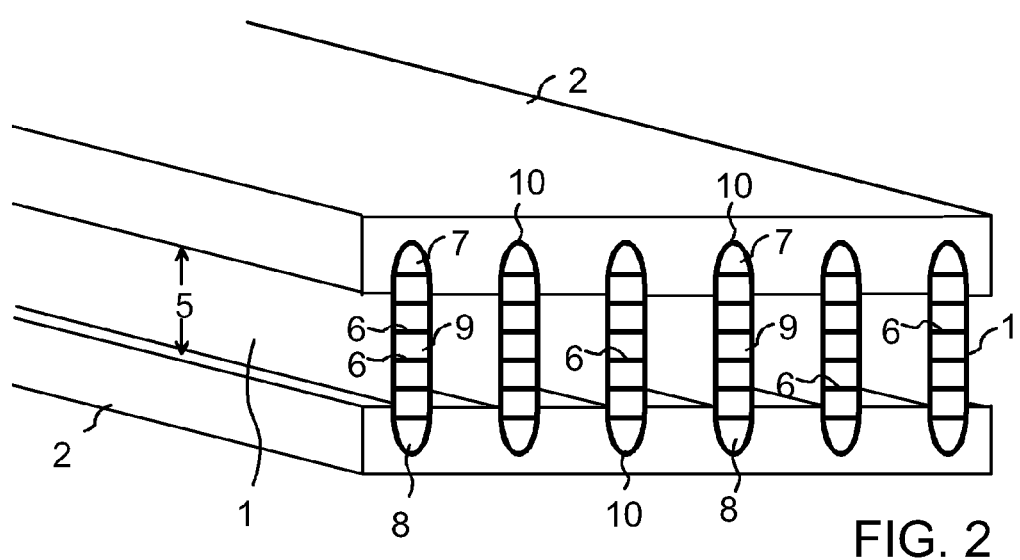
FIG. 2 illustrates an example of an attachment of base plates to the pipe assembly of FIG. 1.

FIG. 1 illustrates a pipe assembly of a cooling element and FIG. 2 illustrates attachment of base plates 2 to the pipe assembly of the cooling element in FIG. 1.

In FIG. 1, the pipe assembly of the cooling element comprises a plurality of pipes 1 providing parallel fluid paths for passing a fluid from an inlet 3 to an outlet 4 of the cooling element. As used herein, the term "parallel fluid paths" refers to an arrangement where the pipes provide alternative flow routes between the inlet 3 and the outlet 4, and it is therefore not necessary that the pipes 1 are parallel, though this may be the case in exemplary implementations.

In FIG. 1, the inlet 3 can receive a cooling fluid from an external device and once this fluid has been passed via the pipes 1 to the outlet 4, the fluid can be returned to the external device for cooling.

In accordance with exemplary embodiments, the cooling element can include a plurality of base plates 2 for receiving electronic components. The electronic components can be attached to the base plates according to any known techniques, such as by screw attachments or gluing, for instance. In the embodiment of FIG. 2 it is shown, by way of example, that the base plates 2 have been attached to opposite sides of the pipes 1. This is not necessary, however, in all embodiments, as it is possible to have all base plates 2 on the same side of the pipes 1.

In the embodiment of FIG. 2, where the base plates 2 are attached to corresponding locations, but on opposite sides of the plurality of pipes 1, a gap 5 separates the base plates 2 from each other. This gap 5 can eliminate the risk of heat transfer between the base plates 2 and the components attached to the respective base plates. In order to still reduce the risk of such heat transfer, the pipes 1 are divided by longitudinal intermediate walls 6 into at least two different channels 7 and 8. Both of these channels convey fluid between the inlet 3 and outlet 4 of the cooling element in the same flow direction. The base plates 2 located on the opposite sides of the pipes 1 are in contact with walls of different channels 7 and 8. In this way heat is transferred to fluid in channel 7 from the upper base plate 2 in FIG. 2 and correspondingly, heat is transferred to fluid in channel 8 from the lower base plate 2 in FIG. 2.

In the example of FIG. 2, the pipes 1 are divided by longitudinal internal walls 6 into more than two different channels, such that at least one of the channels 9 comprises walls of which none is in contact with any one of the base plates 2. In FIG. 2 it can be seen that the channels are arranged on top of each other between the base plates 2, and that channel 9, for instance, has walls of which none is in direct contact with the base plates 2. Consequently, this additional channel 9, which is not necessary in all embodiments, can ensure that no significant amount of heat transfer can take place between channels 7 and 8 within the pipes 1.

In the embodiment illustrated in FIG. 2, it is not necessary to pass fluid in each one of the illustrated channels. Instead, some of these channels may be plugged at their ends, in which case air, for instance, contained in these plugged channels can act as an isolating medium preventing heat transfer between the channels 7 and 8 that are in contact with one or more of the base plates.

In FIG. 2, the base plates 2 comprise grooves 10 in the surfaces contacting the pipes 1. Such grooves are not necessary in all embodiments. In FIG. 2, the grooves 10 are located at the locations of the pipes 1 and they have been shaped to allow the pipes 1 to partly protrude into the grooves 10. In this way the area of the contact surface between the pipes 1 and the base plates 2 increases, which can improve the heat transfer from the base plates 2 to the fluid in the channels 7 and 8 of the pipes 1. In addition, the walls of more than one of the channels in the pipes 2 may in this way contact the base plates, as illustrated in FIG. 2, where it can be seen that the upper base plate 2, for instance, is in contact with channel 7 and also with the following channel below channel 7.

The cooling element illustrated in FIGS. 1 and 2 can be manufactured by utilizing steel or aluminum base plates, for instance, in which grooves (not necessary in all embodiments) have been machined or produced during extrusion, for instance. The pipes may comprise (e.g., consist of) aluminum pipes, for instance, in which the longitudinal internal walls (not necessary in all embodiments) have been produced during extrusion of the pipes, for instance. The end parts with the inlet 3 and outlet 4, which interconnect the pipes 1, can be attached to the pipes 1 in known ways, such as by gluing, welding or soldering, for instance. In order to attach the base plate 2 to the pipes 1, the pipes 1 and the base plates 2 can be arranged on top of each other in an oven with a suitable soldering compound therebetween. After being kept in the oven for a sufficient time at a suitable temperature, the soldering compound can melt and attach the pipes 1 and the base plates 2 to each other once the soldering compound has been allowed to cool.

FIGS. 3 and 4 illustrate an exemplary embodiment of a cooling element. In the embodiment of FIGS. 3 and 4, the pipe assembly illustrated in FIGS. 1 and 2 may be utilized, and the base plates attached to the pipe assembly may be shaped as illustrated in FIG. 2.

In the embodiment of FIGS. 3 and 4, base plates of different sizes can be utilized. In this embodiment it is assumed, by way of example, that the base plate 11 on a first side of the plurality of pipes 1 is dimensioned to cover substantially the same area as covered by the pipes 1. Consequently, this base plate 11 is shown having a rectangular shape and extending all the way from the inlet 3 to the outlet 4, and from the outermost pipe 1 on the left in FIG. 3 to the outermost pipe 1 on the right in FIG. 3.

On the second side of the pipes 1, smaller base plates can be utilized. In this example three base plates 12 can be arranged in the middle region of the cooling element 13, and four even smaller base plates 14 can be arranged near the edges of the cooling element 13. Consequently, the cooling element comprises on the second side of the pipes 1 base plates 12 and 14 spread out over substantially the entire area covered by the pipes 1.

In the examples of FIGS. 3 and 4 twelve electronic components 15 are attached to the base plate 11 on the first side. In the case of a cooling element for a frequency converter, for instance, these components 15 may be capacitors, for instance. The base plates 12 in the middle region on the second side each comprise a plurality of electronic components 16, such as power electronics, for instance. Each of the base plates 14 near the edges of the cooling element 13 comprise a single component 17, such as a resistor, for instance. In this way, adequate and efficient cooling can be ensured for each single component, while avoiding a situation in which heat generated by the different components is conducted such that the operation of other components is disturbed.

Figure 5:
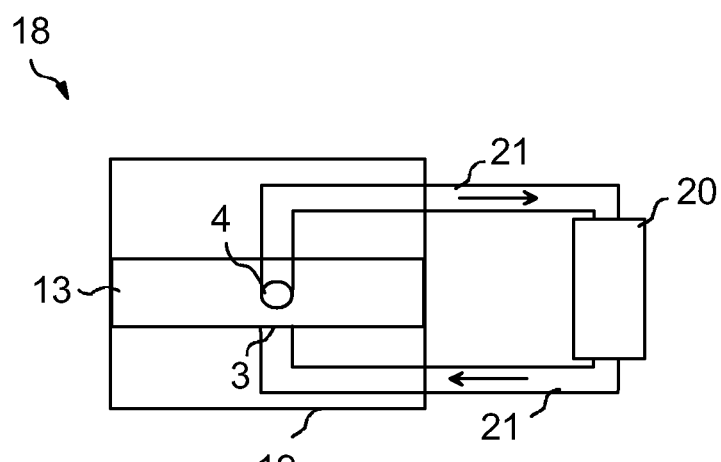
FIG. 5 illustrates an exemplary cabinet with a cooling element.

FIG. 5 illustrates an exemplary cabinet 18 with a cooling element. The cabinet may be an electronics cabinet of a frequency converter, for instance, which is equipped with a cooling element 13 as illustrated in any of FIGS. 1-4.

In FIG. 5, the electronics cabinet 18 is seen from above with the roof removed. The cooling element 13 has been dimensioned to extend between the side walls of the housing 19 of the electronics cabinet 18. In this way, provided that the cooling element 13 has a rigid construction, the cooling element 13 may act as a support structure in the electronics cabinet 18. Consequently, the cooling element can carry the weight of the components attached thereto, and, in addition, can support the side walls of the housing 19.

FIG. 5 also illustrates a cooling device 20 arranged outside the housing 19 of the electronics cabinet 18. This cooling device 20 is connected by pipes 21 to the inlet 3 and outlet 4 of the cooling element. Fluid warmed up by heat originating from the electronic components is fed via the outlet 4 to the cooling device 20. The fluid is cooled by the cooling device 20, and after this the fluid is returned to the inlet of the cooling element 3.

It will be appreciated by those skilled in the art that the present disclosure can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A cooling element for an electronic apparatus, the cooling element comprising:
   an inlet for receiving fluid;
   an outlet for forwarding the fluid from the cooling element;
   plural pipes providing parallel fluid paths for passing the fluid from the inlet to the outlet;
   plural base plates for receiving electronic components, the base plates being attached to the plural pipes for conducting heat generated by the electronic components when operative to the fluid in the pipes;
   wherein at least two of the base plates are attached to opposite sides of the plural pipes, and more than one base plate is attached to at least one side of the plural pipes; and
   the plural pipes comprise:
   longitudinal internal walls that divide the pipes into at least two different channels for conveying the fluid from the inlet to the outlet, such that the base plates located on opposite sides of the pipes are in contact with walls of different channels for conducting heat into fluid of different channels.

2. The cooling element according to claim 1, wherein the plural pipes comprise:
longitudinal internal walls that divide the pipes into more than two different channels, and wherein at least one of the channels includes walls which do not contact with any one of the base plates.

3. The cooling element according to claim 1, wherein at least one of the base plates comprises:
grooves in a surface contacting the plural pipes, the grooves being located at the pipes and shaped to allow the pipes to partly protrude into the grooves.

4. The cooling element according to claim 1, wherein the base plates are attached to the plural pipes by solder.

5. The cooling element according to claim 1, wherein at least two of the base plates are attached to corresponding locations on opposite sides of the plural pipes.

6. The cooling element according to claim 1, wherein at least two of the base plates are spread out over substantially an entire area covered by the plural pipes.

7. An electronic apparatus, comprising:
a housing;
electronic components enclosed by the housing;
a cooling element enclosed by the housing and including:
an inlet for receiving fluid;
an outlet for forwarding the fluid from the cooling element;
plural pipes providing parallel fluid paths for passing the fluid from the inlet to the outlet;
plural base plates for receiving the electronic components, the base plates being attached to the plural pipes for conducting heat generated by the electronic components when operative to the fluid in the pipes wherein at least two of the base plates are attached to opposite sides of the plural pipes and more than one base plate is attached to at least one side of the plural pipes; and
a cooling device arranged outside the housing and connected to the inlet and outlet of the cooling element for cooling fluid received via the outlet and for returning the cooled fluid to the cooling element via the inlet.

8. The cooling element according to claim 7, wherein at least two of the base plates are attached to opposite sides of the plural pipes and more than one base plate is attached at least one side of the plural pipes, and wherein the plural pipes comprise:
longitudinal internal walls that divide the pipes into at least two different channels for conveying the fluid from the inlet to the outlet, such that the base plates located on opposite sides of the pipes are in contact with walls of different channels for conducting heat into fluid of different channels.

9. The cooling element according to claim 1, wherein the channels comprise at least three channels including a center channel provided between a first channel and a second channel, the center channel containing an isolating medium for preventing heat transfer between the first channel and the second channel.

10. The electronic apparatus according to claim 8, wherein the channels comprise at least three channels including a center channel providing between a first channel and a second channel, the center channel containing an isolating medium for preventing heat transfer between the first channel and the second channel.

* * * * *